United States Patent
Brofman et al.

(10) Patent No.: US 8,870,051 B2
(45) Date of Patent: Oct. 28, 2014

(54) FLIP CHIP ASSEMBLY APPARATUS EMPLOYING A WARPAGE-SUPPRESSOR ASSEMBLY

(75) Inventors: Peter J. Brofman, Hopewell Junction, NY (US); Jae-Woong Nah, New York, NY (US); Katsuyuki Sakuma, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/463,412

(22) Filed: May 3, 2012

(65) Prior Publication Data
US 2013/0292455 A1   Nov. 7, 2013

(51) Int. Cl.
*B23K 37/04*   (2006.01)

(52) U.S. Cl.
USPC ............. 228/5.5; 228/42; 228/44.3; 228/44.7

(58) Field of Classification Search
None
See application file for complete search history.

(56) References Cited

U.S. PATENT DOCUMENTS

| | | | | |
|---|---|---|---|---|
| 3,207,503 A * | 9/1965 | Clover, Jr. et al. | ............... | 269/21 |
| 3,230,338 A * | 1/1966 | Kawecki | ................... | 219/85.16 |
| 3,382,564 A * | 5/1968 | Gallentine | ................. | 228/173.5 |
| 3,608,809 A * | 9/1971 | Cushman | ....................... | 228/5.5 |
| 4,166,562 A * | 9/1979 | Keizer et al. | ................... | 228/5.1 |
| 4,255,644 A * | 3/1981 | Delorme | ........................ | 219/233 |
| 4,411,149 A * | 10/1983 | Delorme | ........................ | 72/385 |
| 4,731,923 A * | 3/1988 | Yagi et al. | ...................... | 29/833 |
| 4,787,548 A * | 11/1988 | Abbagnaro et al. | ........... | 228/6.2 |
| 4,828,162 A * | 5/1989 | Donner et al. | ................. | 228/6.2 |
| 4,844,324 A * | 7/1989 | Todd | ........................ | 228/180.21 |
| 4,895,294 A * | 1/1990 | Thore | .......................... | 228/222 |
| 4,908,938 A * | 3/1990 | Thorwarth et al. | ............. | 29/846 |
| 4,972,990 A * | 11/1990 | Abbagnaro et al. | ......... | 228/20.1 |
| 5,139,193 A * | 8/1992 | Todd | ........................ | 228/180.21 |
| 5,368,217 A * | 11/1994 | Simmons et al. | ............. | 228/6.2 |
| 5,370,299 A * | 12/1994 | Tanabe et al. | ................. | 228/176 |
| 5,373,731 A * | 12/1994 | Tanaka et al. | .................... | 73/104 |
| 5,425,491 A * | 6/1995 | Tanaka et al. | ................. | 228/44.7 |
| 5,441,194 A * | 8/1995 | Nishimura et al. | ............ | 228/6.2 |
| 5,516,027 A * | 5/1996 | Tanabe et al. | ................. | 228/44.7 |
| 5,560,531 A * | 10/1996 | Ruszowski | ....................... | 228/19 |
| 5,639,011 A * | 6/1997 | Jacks et al. | ............... | 228/180.21 |
| 5,862,588 A * | 1/1999 | Heim et al. | ...................... | 29/840 |
| 5,878,944 A * | 3/1999 | Aebersold et al. | ............ | 228/212 |
| 5,909,837 A * | 6/1999 | Safabakhsh et al. | ........... | 228/6.2 |
| 5,984,165 A * | 11/1999 | Inoue et al. | ............... | 228/180.22 |
| 6,056,191 A * | 5/2000 | Brouillette et al. | ........... | 228/254 |

(Continued)

FOREIGN PATENT DOCUMENTS

| | | | |
|---|---|---|---|
| EP | 121910 A * | 10/1984 | |
| JP | 01-186269 A * | 7/1989 | |
| JP | 2005-258152 A * | 9/2005 | |

*Primary Examiner* — Kiley Stoner
(74) *Attorney, Agent, or Firm* — Scully, Scott, Murphy & Presser, P.C.; Louis J. Percello, Esq.

(57) ABSTRACT

A flip chip assembly apparatus includes at least one warpage-suppressor assembly. Each warpage-suppressor assembly can include a side heater, a deformable material pad, and an actuator assembly for moving the side heater and the deformable material pad. Each side heater provides additional heat to peripheral solder balls during bonding of two substrates, thereby facilitating the reflow of the peripheral solder balls. Each deformable material pad contacts, and presses down on, a surface of one of the two substrates under bonding. The deformable material pad(s) can prevent or minimize warpage of the contacted substrate.

25 Claims, 11 Drawing Sheets

(56) References Cited

U.S. PATENT DOCUMENTS

| | | | |
|---|---|---|---|
| 6,068,175 A * | 5/2000 | Heim et al. | 228/45 |
| 6,082,140 A * | 7/2000 | Ackler et al. | 65/36 |
| 6,158,645 A * | 12/2000 | Sakamoto et al. | 228/110.1 |
| 6,179,196 B1 * | 1/2001 | Heim et al. | 228/6.1 |
| 6,237,832 B1 * | 5/2001 | Chung | 228/44.7 |
| 6,257,478 B1 * | 7/2001 | Straub | 228/6.2 |
| 6,264,089 B1 * | 7/2001 | Hasegawa et al. | 228/5.5 |
| 6,460,755 B1 * | 10/2002 | Inoue et al. | 228/246 |
| 6,648,045 B2 * | 11/2003 | Yamauchi | 156/580 |
| 6,761,304 B2 * | 7/2004 | Ruszowski | 228/180.21 |
| 6,814,273 B2 * | 11/2004 | Sullivan et al. | 228/4.5 |
| 7,235,886 B1 | 6/2007 | Chandran et al. | |
| 7,347,347 B2 * | 3/2008 | Kira et al. | 228/1.1 |
| 7,357,288 B2 * | 4/2008 | Hosotani et al. | 228/6.2 |
| 7,546,941 B2 * | 6/2009 | No et al. | 228/41 |
| 7,828,193 B2 * | 11/2010 | Ishikawa et al. | 228/110.1 |
| 8,003,914 B2 * | 8/2011 | Nishio et al. | 219/121.63 |
| 8,210,417 B2 * | 7/2012 | Akiyama et al. | 228/6.2 |
| 8,292,159 B2 * | 10/2012 | Maki et al. | 228/103 |
| 8,365,386 B2 * | 2/2013 | Vontz et al. | 29/464 |
| 2002/0092887 A1 * | 7/2002 | Hosotani et al. | 228/44.7 |
| 2002/0100791 A1 * | 8/2002 | Mukuno et al. | 228/49.5 |
| 2002/0130164 A1 * | 9/2002 | Matsuki et al. | 228/206 |
| 2004/0149803 A1 * | 8/2004 | Imanishi et al. | 228/8 |
| 2005/0034302 A1 * | 2/2005 | Hosotani et al. | 29/840 |
| 2005/0284567 A1 * | 12/2005 | Huang | 156/311 |
| 2006/0273141 A1 * | 12/2006 | Saito et al. | 228/234.1 |
| 2007/0181644 A1 * | 8/2007 | Ueno et al. | 228/101 |
| 2007/0227648 A1 * | 10/2007 | Tsujimoto et al. | 156/230 |
| 2008/0041838 A1 * | 2/2008 | Miura et al. | 219/209 |
| 2008/0156789 A1 * | 7/2008 | Devey et al. | 219/444.1 |
| 2008/0245472 A1 * | 10/2008 | Hirata et al. | 156/264 |
| 2009/0001133 A1 * | 1/2009 | Kuramochi | 228/103 |
| 2009/0001140 A1 * | 1/2009 | Katayama et al. | 228/212 |
| 2009/0166398 A1 * | 7/2009 | Kishi et al. | 228/203 |
| 2009/0184155 A1 * | 7/2009 | Kim et al. | 228/174 |
| 2009/0256891 A1 * | 10/2009 | Anderson et al. | 347/61 |
| 2010/0024667 A1 * | 2/2010 | Ikura | 100/38 |
| 2010/0163602 A1 * | 7/2010 | Okamoto et al. | 228/102 |
| 2011/0079634 A1 * | 4/2011 | Lee et al. | 228/264 |
| 2011/0305787 A1 * | 12/2011 | Ishii et al. | 425/385 |
| 2012/0091187 A1 * | 4/2012 | Akiyama et al. | 228/221 |
| 2012/0104075 A1 * | 5/2012 | Kang et al. | 228/180.5 |
| 2012/0111922 A1 * | 5/2012 | Hwang et al. | 228/6.2 |
| 2012/0217287 A1 * | 8/2012 | Kumar et al. | 228/178 |
| 2012/0292375 A1 * | 11/2012 | Blais et al. | 228/49.5 |
| 2012/0318856 A1 * | 12/2012 | Hirakawa | 228/221 |
| 2013/0119112 A1 * | 5/2013 | Sukekawa et al. | 228/42 |
| 2013/0153645 A1 * | 6/2013 | Owens et al. | 228/180.22 |
| 2013/0276299 A1 * | 10/2013 | Kiridena et al. | 29/650 |

\* cited by examiner

FLIP CHIP ASSEMBLY APPARATUS EMPLOYING A WARPAGE-SUPPRESSOR ASSEMBLY

BACKGROUND

The present disclosure relates to a method for bonding substrates, and particularly, to a flip chip assembly apparatus employing a warpage-suppressor assembly, and a method of operating the same.

Connections employing an array of solder material portions, such as C4 balls or any other type of solder balls, are susceptible to mechanical stress created by a mismatch in the coefficients of thermal expansion (CTE's) between the semiconductor chip and the other semiconductor chip or the packaging substrate. Such mechanical stress may cause cracks in the solder material portions, back-end-of-lines in chips, or the semiconductor chip(s), causing the semiconductor chip(s) to fail during flip chip assembly process and/or usage.

The problem of mechanical stress caused by the mismatch between CTE's are exacerbated when an organic substrate is employed for a packaging substrate because the mismatch of CTE's is greater between organic substrates and semiconductor substrates than between ceramic substrates and semiconductor substrates. When an organic substrate is used as a packaging substrate for a fine pitch flip chip assembly, substrate warpage can occur in the conventional reflow process during which solder balls reflow. This warpage can result in non-wetting of solder bumps and/or bridging between solder bumps, thereby decreasing the assembly yield.

In general, organic substrates expand and contract more than silicon chips. For example, a silicon chip has a CTE of about 2.6 p.p.m./° C., and an organic substrate has a CTE of about 17 p.p.m./° C. Such a mismatch between CTE's can create thermally-induced stress and strain in a bonded flip-chip structure during the flip chip assembly process. Thermally-induced stress and strain in the flip-chip structure during a reflow process often results in a failure of back-end-of-line (BEOL) interconnect structures.

When a semiconductor chip is bonded to an organic substrate, a predominant fraction of the total heat energy employed to reflow the solder balls is transmitted through the semiconductor chip. Even if the organic substrate is maintained below 100 degrees Celsius and the heat flow from the semiconductor chip into the organic substrate is constricted at the chip area during the reflow of the solder balls, the thermal expansion of the organic substrate is sufficient to cause warpage of the organic substrate. Such warpage of the organic substrate tends to cause non-contacts between peripheral solder balls within the array of solder balls and bonding pads on the organic substrate, thereby causing electrical opens between the semiconductor chip and the organic substrate across the peripheral solder balls. Thus, there exists a need to provide a reliable flip chip joining method that can provide reliable solder bonding despite inherent warpage issues due to the thermal expansion of the organic substrate.

BRIEF SUMMARY

A flip chip assembly apparatus includes at least one warpage-suppressor assembly. Each warpage-suppressor assembly can include a side heater, a deformable material pad, and an actuator assembly for moving the side heater and the deformable material pad. Each side heater provides additional heat to peripheral solder balls during bonding of two substrates, thereby facilitating the reflow of the peripheral solder balls. Each deformable material pad contacts, and presses down on, a surface of one of the two substrates under bonding. The deformable material pad(s) can prevent or minimize warpage of the contacted substrate.

According to an aspect of the present disclosure, a bonding apparatus is provided, which includes: a bonder head configured to hold a first substrate upside down; a base plate configured to hold a second substrate in a position facing the first substrate; and at least one warpage-suppressor assembly including at least a deformable material pad configured to press against a surface of the second substrate in a position, and an actuator assembly for moving the deformable material pad.

According to another aspect of the present disclosure, a method of bonding substrates is provided, which includes: providing a bonding apparatus including a bonder head, a base plate, and at least one warpage-suppressor assembly, wherein each of the at least one warpage-suppressor assembly includes a deformable material pad; attaching a first substrate to the bonder head; attaching a second substrate to the base plate, wherein an array of solder balls is present on one of the first and second substrates; and pressing the second substrate against the base plate employing each of the at least one deformable material pad during a reflow step in which the array of solder balls is reflowed.

DETAILED DESCRIPTION

Figure 1:
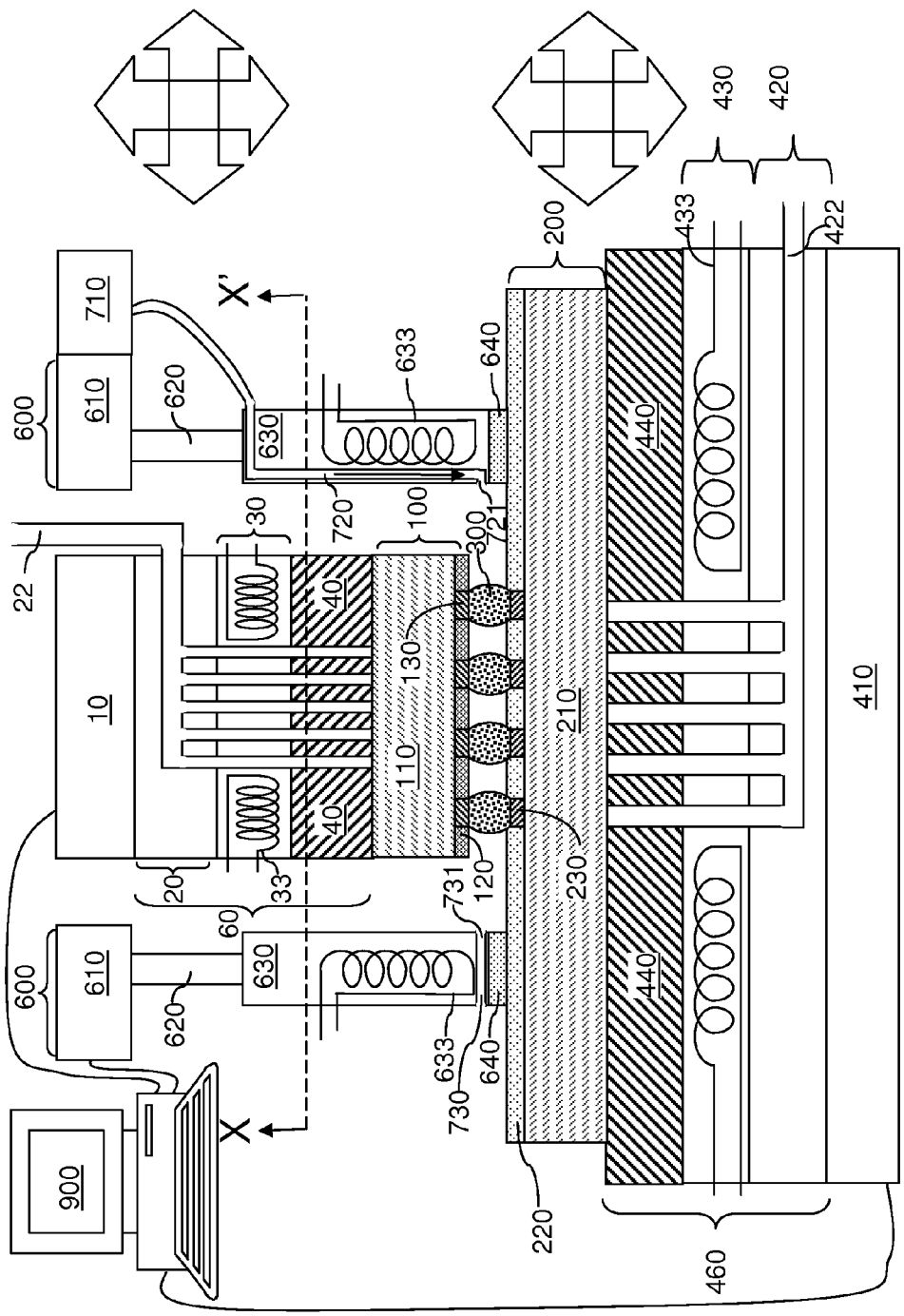
FIG. 1 is a schematic vertical cross-sectional view of an exemplary structure that can be employed for bonding a first substrate to a second substrate according to an embodiment of the present disclosure.

As stated above, the present disclosure relates to a flip chip assembly apparatus employing a warpage-suppressor assembly, and a method of operating the same, which are now described in detail with accompanying figures. It is noted that like and corresponding elements are referred to by like reference numerals. The drawings are not in scale.

Figure 2:
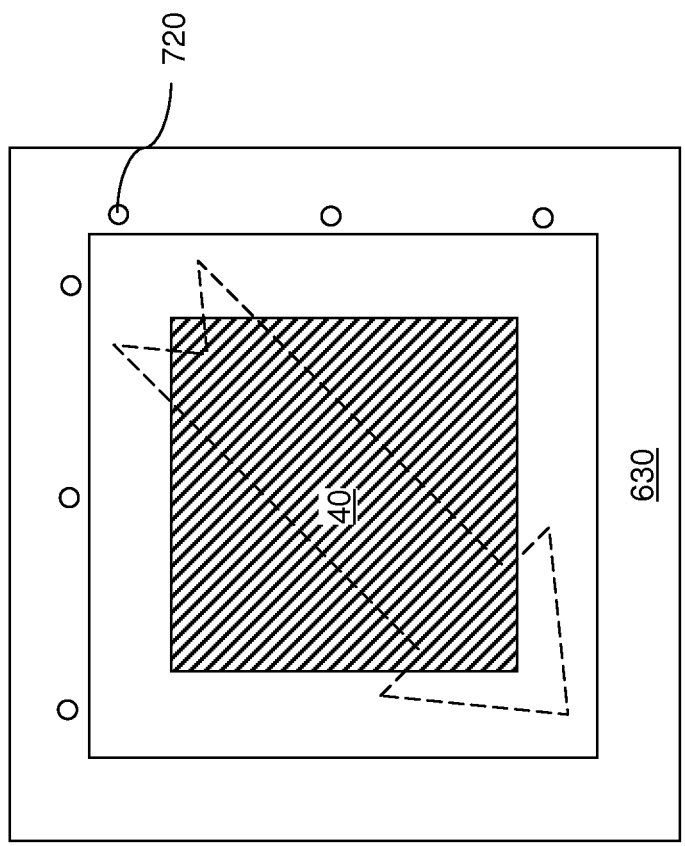
FIG. 2 is a horizontal cross-sectional area of the exemplary structure along the horizontal plane X-X' in FIG. 1.

Referring to FIGS. 1 and 2, an exemplary structure that can be employed for bonding a first substrate to a substrate according to an embodiment of the present disclosure is illustrated in a vertical cross-sectional view. The exemplary structure includes an exemplary bonding apparatus, which includes a bonder head 60, a base plate 460, and at least one warpage-suppressor assembly 600. The exemplary structure further includes a first substrate 100, an array of solder balls 300, and a second substrate 200. The exemplary apparatus can be employed for bonding the first substrate 100 to the second substrate 200.

The bonder head 60 is configured to hold the first substrate 100 upside down. The base plate 460 is configured to hold the second substrate 200 in a position facing the first substrate 100. The base plate 460 functions as a platform to support the second substrate 200.

A back side of the first substrate 100 is attached to the bottom side of the bonder head 60 by vacuum suction. A bonder head movement actuator 10 configured to provide vertical movement of the bonder head 60 relative to the base plate 460 is located above the bonder head 60. The second substrate 200 is initially located beneath the first substrate 100 with sufficient vertical spacing from the first substrate 100 to enable placement and bonding of the array of solder balls 300 between the bottom surface of the first substrate 100 and the top surface of the second substrate 200. The first substrate 100 can be a semiconductor chip, an interposer, or a packaging substrate. The second substrate 200 can be a semiconductor chip, a semiconductor wafer, an interposer, a carrier, or a packaging substrate.

The first substrate 100 can include a first substrate layer 110, a first surface dielectric layer 120, and an array of first bonding pads 130 embedded within the first surface dielectric layer 120. Each bonding pad within the array of first bonding pads 130 can be electrically connected to at least one semiconductor device within the first substrate layer 110 through metal interconnect structures (not shown) embedded in the first substrate layer 110. The first substrate layer 110 includes semiconductor devices that can be, for example, field effect transistors, bipolar transistors, diodes, and/or optical semiconductor devices. The first substrate 100 is held upside down by the bonder head 60, for example, by vacuum suction so that an exposed surface of the first surface dielectric layer 120 is located at the bottommost portion of the first substrate 100.

The second substrate 200 can be another semiconductor chip or a packaging substrate or an interposer. If the second substrate 200 is another semiconductor chip, the second substrate 200 includes semiconductor devices therein. If the second substrate 200 is a packaging substrate, the second substrate 200 includes layers of wiring structures (metal interconnect structures), and can be a ceramic substrate, an organic laminated substrate, a silicone substrate, a metal substrate, or a flexible film substrate. If the second substrate 200 is an interposer, the second substrate 200 includes through vias.

The second substrate 200 includes a second substrate layer 210, a second surface dielectric layer 220, and an array of second bonding pads 230 embedded within the second surface dielectric layer 220. Each bonding pad within the array of second bonding pads 230 can be electrically connected to the layers of wiring within the second substrate 200.

The bonder head movement actuator 10 can operate to enable the vertical movement of the bonder head 60 and the first substrate 100 relative to the base plate 460 and the second substrate 200 fixed thereto before the array of solder balls 300 is bonded to both the first substrate 100 and the second substrate 200. Optionally, the bonder head movement actuator 10 may be configured to enable a lateral movement of the bond head 60 and the first substrate 100. The upper bidirectional arrows schematically represent possible directions of movement for the bonder head 60. The bonder head movement actuator 10 is configured to provide upward and downward vertical movement of the bonder head 60 relative to the base plate 460.

The bonder head 60 can include a bonder head conductive plate 40, a bonder head heater assembly 30 that includes at least one bonder head heating coil 33, and a chip support mechanism 20. The bonder head heater assembly 30 can be configured to generate and transmit heat to the bonder head conductive plate 40 by conduction and/or radiation and/or convection.

The chip support mechanism 20 holds the first substrate 100 upside down. The chip support mechanism 20 can include a vacuum manifold 22 that extends through the bonder head conductive plate 40 and to at least one hole located on the bottom surface of the bonder head conductive plate 40. The opposite end of the vacuum manifold 22 includes at least one vacuum connection port that is configured to be connected to a vacuum pump. The vacuum suction provided to the back side of the first substrate 100 can mechanically support the first substrate 100. Alternately, any other chip support mechanism 20 that is capable of mechanically supporting the first substrate 100 can be employed instead of the substrate support mechanism employing vacuum pumping.

Thus, the bonder head 60 can include a bonder head conductive plate 40 configured to contact the first substrate 100, the bonder head heater assembly 30 configured to heat the bonder head conductive plate 40, and the chip support mechanism 20 configured to hold the first substrate 100 against the bonder head conductive plate 40.

The array of solder balls 300 are typically attached to the array of first bonding pads 130 prior to mounting on the bonder head 60 employing methods known in the art. The bonder head 60 is configured to hold the first substrate 100 upside down under the horizontal plane of the bottommost surface of the bonder head conductive plate 40. The second substrate 200 is held upright so that an exposed surface of the second surface dielectric layer 220 is located at the topmost portion of the second substrate 200 and faces the bottommost surface of the first substrate 100.

The base plate 460 includes a base conductive plate 440, a base plate heater assembly 430 that includes at least one base plate heating coil 433, and a substrate support mechanism 420. The base conductive plate 440 includes a high thermal conductivity material. The second substrate 200 can be held at a fixed location by the base plate 460. A base plate movement actuator 410 may be located beneath the base plate 460, and may be configured to move the base plate 460 laterally and/or vertically. The lower bidirectional arrows schematically represent possible directions of movement for the upper portion of the base plate 460 and the second substrate 200.

The base plate heater assembly 430 is configured to generate and transmit heat to the base conductive plate 440 by conduction and/or radiation and/or convection. Typically, the base plate heater assembly 430 is configured to transmit heat to the base conductive plate 440 by conduction. The at least one base plate heating coil 433 is electrically connected to an electrical power source (not shown) that provides electrical power in the form of direct current (DC) or alternate current (AC).

The substrate support mechanism 420 holds the second substrate 200 in the upright position. The substrate support mechanism 420 can include a vacuum manifold 422 that extends through the base conductive plate 440 and to at least one hole located on the bottom surface of the base conductive plate 440. The opposite end of the vacuum manifold 422 includes at least one vacuum connection port that is configured to be connected to a vacuum pump. The vacuum suction provided to the back side of the second substrate 200 can mechanically support the second substrate 200. Alternately, any other substrate support mechanism 420 that is capable of mechanically supporting the second substrate 200 can be employed instead of the substrate support mechanism employing vacuum pumping.

Thus, the base plate 460 can includes the base conductive plate 440 configured to contact the second substrate 200, the base plate heater assembly 430 configured to heat the base conductive plate 440, and the substrate support mechanism 420 configured to hold the second substrate 200 against the base conductive plate 440.

Each of at least one warpage-suppressor assembly 600 includes at least a deformable material pad 640 configured to press against the top surface of the second substrate 200 in a position, which is herein referred to as a constraint position. Each of at least one warpage-suppressor assembly 600 includes an actuator assembly for moving the deformable material pad 640. The actuator assembly can include, for example, a movable actuator element 620 that is positioned at a fixed relative position with respect to a deformable material pad 640 and moves in a vertical direction with the deformable material pad 640, and a static actuator element 610 having a casing that stays stationary relative to the base plate 640 and causes the movable actuator element 620 to move along the vertical direction.

Optionally, each of the at least one warpage-suppressor assembly 600 can further include a side heater 630 configured to heat a region between the first substrate 100 and the second substrate 200. Each side heater 630 can include a side heating coil 633, which is electrically connected to an electrical power source (not shown) that provides electrical power in the form of direct current (DC) or alternate current (AC). In one embodiment, each side heater 630 can be configured to be vertically movable by one of the at least one actuator assembly (610, 620). In one embodiment, a side heater 630 can be attached to an upper surface of one of the at least one deformable material pad 640.

The exemplary apparatus can further include a control means 900, which can be embodied in a computer or any other stationary or portable computing device.

In one embodiment, the computing means 900 can be configured to turn on each of the at least one side heater 630 during a reflow step in which solder balls 300 between the first substrate 100 and the second substrate 200 are reflowed.

In another embodiment, the control means 900 can further be configured to control the actuator assembly (610, 620) to cause the at least one deformable material pad 640 to press against the surface of the second substrate 200 during a reflow step.

In yet another embodiment, the control means 900 can further be configured to control the actuator assembly (610, 620) to cause the at least one deformable material pad 640 not to press against the surface of the second substrate before a predetermined time prior to the reflow step. The predetermined time can be, for example, from 5 minutes to 1 second before commencement of the reflow step, although earlier and later times can also be employed.

In still another embodiment, the control means 900 can further be configured to control the actuator assembly (610, 620) to cause the at least one deformable material pad 640 to press against the surface of the second substrate 200 during a first time period of a cooldown step that follows the reflow step, and not to press against the surface of the second substrate 200 during a second time period of the cooldown step that follows the first time period of the cooldown step. Thus, the control means 900 can prevent the at least one deformable material pad 640 from pressing against the surface of the second substrate 200 during the second time period of the cooldown step.

In one embodiment, each of the at least one deformable material pad 640 can include an elastically deformable material. In another embodiment, each of the at least one deformable material pad 640 can include a thermally insulating deformable material. In yet another embodiment, each of the at least one deformable material pad 640 can include a thermally insulating elastically deformable material. For example, each of the at least one deformable material pad 640 can include at least one of an elastomer, a shape memory alloy, or, and plastics. In even another embodiment, a thermally insulating material can be selected for each of the at least one deformable material pad 640 to minimize transfer of heat from the at least one side heater 630 to the second substrate 200. In a further embodiment, a heat shield (not shown) can be provided between a pair of a deformable material pad 640 and a side heater 630.

In one embodiment, at least one warpage-suppressor assembly 600 can be a single contiguous warpage-suppressor assembly configured to laterally surround the first substrate 100 during the reflow step.

In one embodiment, the exemplary apparatus can further include a purge gas supply means configured to supply a purge gas around solder balls 300 between the first substrate 100 and the second substrate 200 during the reflow step. The purge gas supply means can include, for example, a purge gas supply system 710 and a purge gas supply tube 720. The purge gas can include an inert gas such as nitrogen, helium, argon, xenon, or any combination thereof. Alternately or additionally, the purge gas can include a reducing gas, i.e., a gas that provides a reducing ambient, such as formic acid vapor, forming gas (a mixture of hydrogen and nitrogen), hydrogen, or a combination thereof. The purge gas can prevent or retard oxidation of surfaces of the solder balls 300 during the reflow step.

The purge gas supply system 710 can include, for example, a combination of a gas flow regulator and a gas tank that includes a compressed purge gas or a liquefied purge gas. In one embodiment, the purge gas supply system 710 can be attached to a static actuator element 610 or the bonder head movement actuator 10.

The purge gas supply tube 720 can be an airtight tube that functions as a conduit for the purge gas that guides the purge gas into a volume laterally surrounded by the at least one warpage-suppressor assembly 600. A portion of the purge gas supply tube 720 can be flexible to accommodate vertical movement of the at least one side heater 630 relative to the actuator assembly (610, 620). The outlet opening 721 of the purge gas supply tube 720 can be directed toward the array of solder balls 300. In one embodiment, the at least one warpage-suppressor assembly 600 can be a single contiguous warpage-suppressor assembly configured to laterally confine the purge gas.

In one embodiment, a portion of the purge gas supply tube 720 can be a gas heating tube that passes through one of the at least one side heater 630 for heating the purge gas prior to flowing the purge gas around the solder balls 300. By heating the purge gas prior to injecting the purge gas toward the solder balls 300, cooling of the solder balls 300 by the purge gas can be minimized. In one embodiment, the purge gas can be heated to a temperature greater than the temperature of the second substrate 200 during the reflow step. In one embodiment, the temperature of the purge gas can be controlled to be below a temperature at which the purge gas interacts with the material of the solder balls 300. For example, if the purge gas includes formic acid vapor, the temperature of the purge gas can be controlled to be below 150 degrees Celsius to avoid reaction between the material of the solder balls 300 and the formic acid vapor.

In one embodiment, a purge gas extraction means 730 configured to extract the purge gas during the reflow step can be optionally provided. The purge gas extraction means 730 can be a passive structure such as an opening through one of the at least one side heater 630, or can include a device including a tube and an air-flow controlling device such as a fan that is provided within the tube, in front of the tube, or behind the tube. The direction of a dotted arrow in FIG. 2 represents the direction of the flow of the purge gas. A purge gas outlet 731 can be provided on a surface of the at least one warpage-suppressor assembly 600 in proximity to the solder balls 300.

In one embodiment, the control means 900 can be configured to turn on the flow of the purge gas at a time coinciding with, or having a predetermined offset relative to, commencement of a reflow step. The timing of the turn-on and turn-off of the flow of the purge gas can be adjusted to prevent or retard the oxidation of the solder balls 300.

Figure 3:
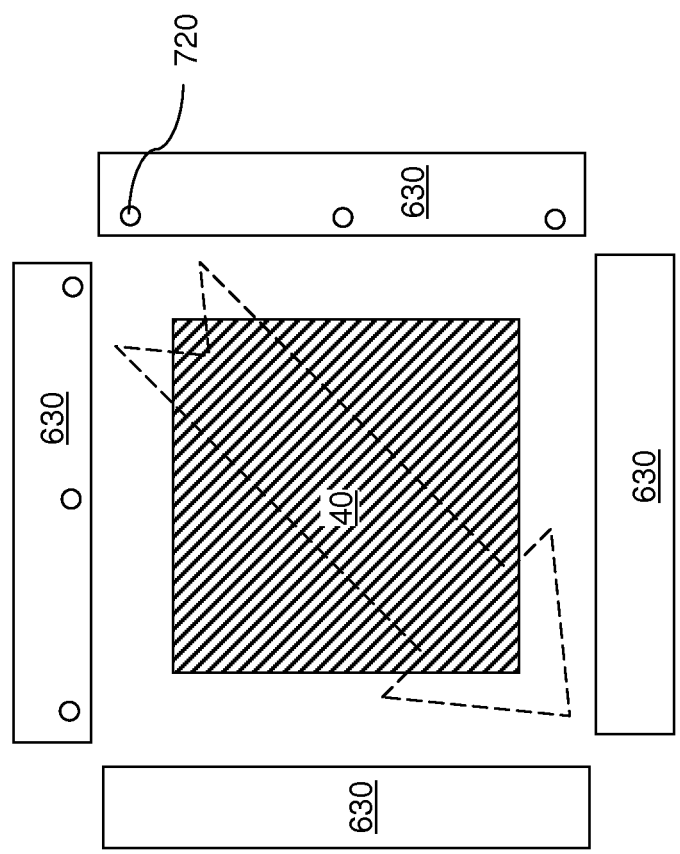
FIG. 3 is a horizontal cross-sectional area of a first variation of the exemplary structure along a horizontal plane corresponding to the plane X-X' in FIG. 1.
Figure 4:
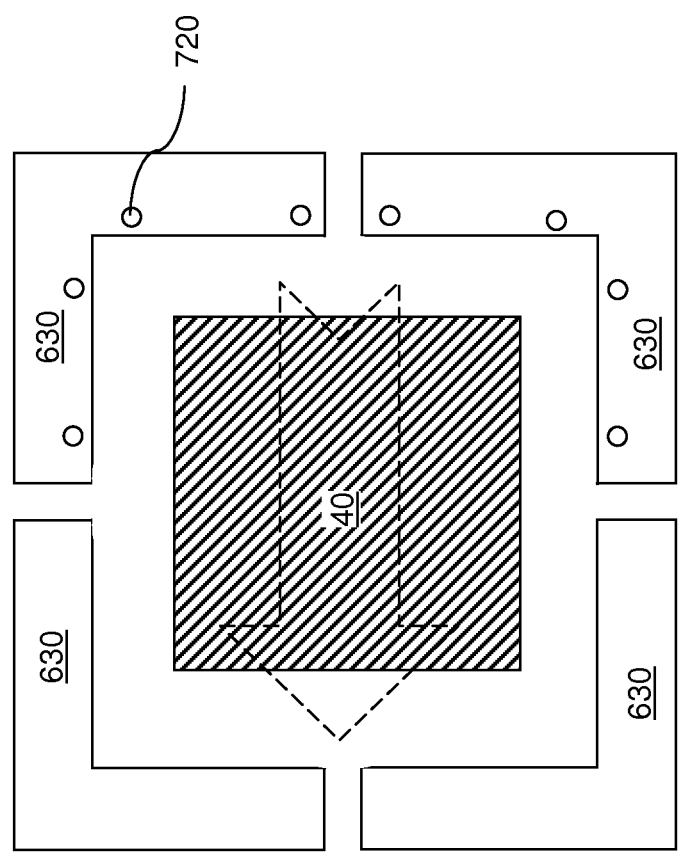
FIG. 4 is a horizontal cross-sectional area of a second variation of the exemplary structure along a horizontal plane corresponding to the plane X-X' in FIG. 1.

Referring to FIGS. 3 and 4, a first variation and a second variation, respectively, of the exemplary structure are illustrated along a horizontal plane corresponding to the plane X-X' in FIG. 1. The first and second variations of the exemplary structure can be derived from the exemplary structure of FIGS. 1 and 2 by employing a plurality of warpage-suppressor assemblies 600 configured to laterally surround the first substrate 100 during the reflow step instead of a single contiguous warpage-suppressor assembly that contiguously surrounds the first substrate 100 laterally during the reflow step.

In one embodiment, the plurality of warpage-suppressor assemblies 600 can have lateral gaps thereamongst during the reflow step. If a purge gas is employed, the lateral gaps can provide an exit path for the purge gas depending on the presence or absence of a purge gas extraction means 730 and depending on the relative size of any purge gas outlet 731 and the dimensions of the lateral gaps.

In one embodiment, the plurality of warpage-suppressor assemblies 600 can be configured to provide a laterally sealed volume by eliminating the lateral gaps, i.e., by causing the plurality of warpage-suppressor assemblies 600 to laterally contact one another. The directions of dotted arrows in FIGS. 3 and 4 represent the directions of the flow of the purge gas in a case where a relative large purge gas outlet 731 and relatively small lateral gaps among the plurality of warpage-suppressor assemblies 600 are present.

Figure 5:
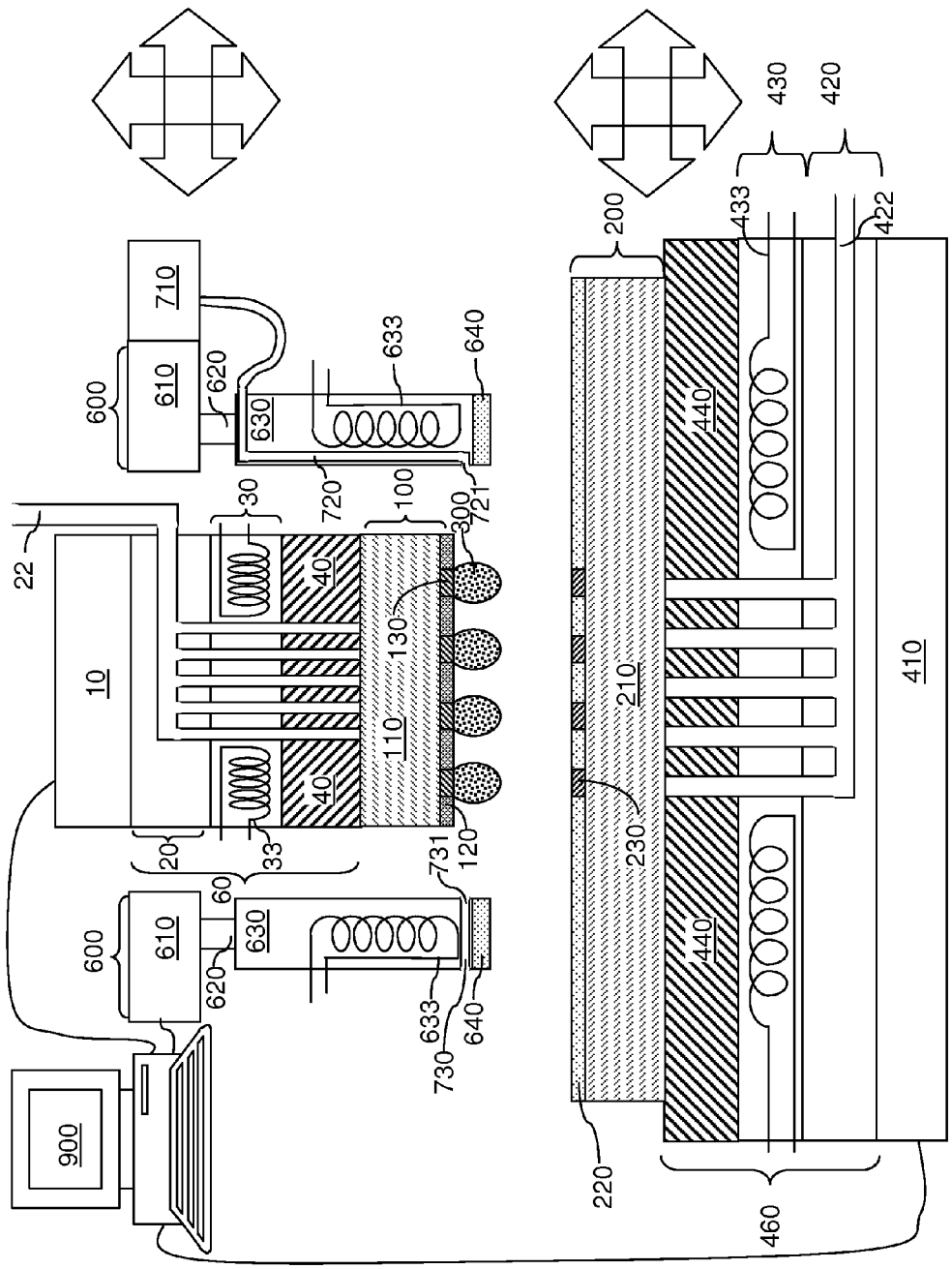
FIG. 5 is a vertical cross-sectional view of the exemplary structure during alignment of a first substrate relative to the second substrate according to an embodiment of the present disclosure.

Referring to FIG. 5, a method of operating the exemplary apparatus to bond a first substrate 100 to a second substrate 200 is illustrated. The first substrate 100 is attached to the bonder head 60 employing, for example, vacuum suction. The second substrate is attached to the base plate 460 employing, for example, vacuum suction. The array of solder balls 300 can be present on one of the first and second substrates (100, 200) or on both substrates. The first substrate 100 and/or the second substrate 200 are aligned relative to each other so that an array of bonding pads that are not bonded the array of solder balls 300 (e.g., the array of second bonding pads 230) are aligned to the array of solder balls 300. The at least one warpage-suppressor assembly 600 does not contact the second substrate 200. The at least one warpage-suppressor assembly 600 can laterally surround, and is laterally spaced from, the first substrate 100. The alignment of the first and second substrates (100, 200) can be performed manually or automatically, for example, employing a camera (not shown) and an image analysis program that runs on the control means 900 or on another computer, and provides control signals to the bonder head movement actuator 10 and/or the base plate movement actuator 410.

In one embodiment, the second substrate 200 is mounted to the front side a base plate 460. The second substrate 200 can be mounted on the base plate 460 by suction applied to the back side of the second substrate layer 110 through the base plate 460. The base plate 460 can minimize the warpage of the second substrate 200 during the boding process by maintaining the second substrate 200 flat through application of vacuum suction to the back surface of the second substrate 200. In one embodiment, the second substrate 200 can be mounted to the base plate 460 at room temperature or at a temperature less than the temperature of the second substrate 200 during a subsequent reflow step for solder material portions.

The first substrate 100 can be provided in a state in which an array of solder balls 300 is bonded to the array of first bonding pads 130. The first substrate 100 can be held upside down and is mounted to a bonder head 60. The array of solder balls 300 faces the second substrate 200 after the mounting of the first substrate 100 on the bonder head 60. The bottom surface of the bonder head 60 can be flat so that the upper surface of first substrate 100 can be held flat, for example, by vacuum suction, during subsequent bonding. In one embodiment, the first substrate 100 can be mounted to the bonder head 60 at room temperature or at a temperature less than the temperature of the bonder head 60 during a subsequent reflow step for the array of solder balls 300.

The second substrate 200 has a different coefficient of thermal expansion than the first substrate 100. In an illustrative example, the second substrate 200 can have a coefficient of thermal expansion that is at least one and a half times the corresponding coefficient of thermal expansion of the first substrate 100 at each temperature within the temperature range between 20 degrees Celsius and 250 degrees Celsius. This condition can be satisfied if the second substrate 200 is an organic packaging substrate and the first substrate 100 is a silicon chip, a silicon germanium chip, or a germanium chip. It is understood that coefficients of thermal expansion for the second substrate 200 and the first substrate 100 are compared at the same temperature, which can be any temperature between 20 degrees Celsius and 250 degrees Celsius.

Before or after the first substrate 100 is placed over the second substrate 200, the second substrate is heated to a first temperature greater than room temperature, or can remain at room temperature. Further, the first substrate 100 is heated to a second temperature different from the first temperature and greater than room temperature. The second temperature is selected to be equal to greater than the melting temperature of the material of the array of solder balls 300. The melting temperature refers to the temperature at which the material of the array of solder balls 300 begins to liquefy, i.e., melt.

The first temperature and the second temperature are lower than the melting temperature of the array of the solder balls 300 in order to prevent premature reflow of the array of the solder balls 300. The first temperature may be lesser than, equal to, or greater than the second temperature.

In case the array of solder material portions includes conventional solder materials, the second temperature can be at or greater than 200 degrees Celsius. In case the second substrate 200 is an organic packaging substrate, the corresponding first temperature is typically at or less than 100 degrees Celsius. The thermal expansion of the first substrate 100 at the second temperature (which is the increase in a lateral dimension per unit length of the first substrate 100 at the second temperature relative to 20 degrees Celsius) can be between 70% and 130%, and preferably between 90% and 110%, and more preferably between 97% and 103%, of the thermal expansion of the second substrate 200 (which is the increase in a lateral dimension per unit length of the second substrate 200 at the first temperature relative to 20 degrees Celsius).

Figure 6:
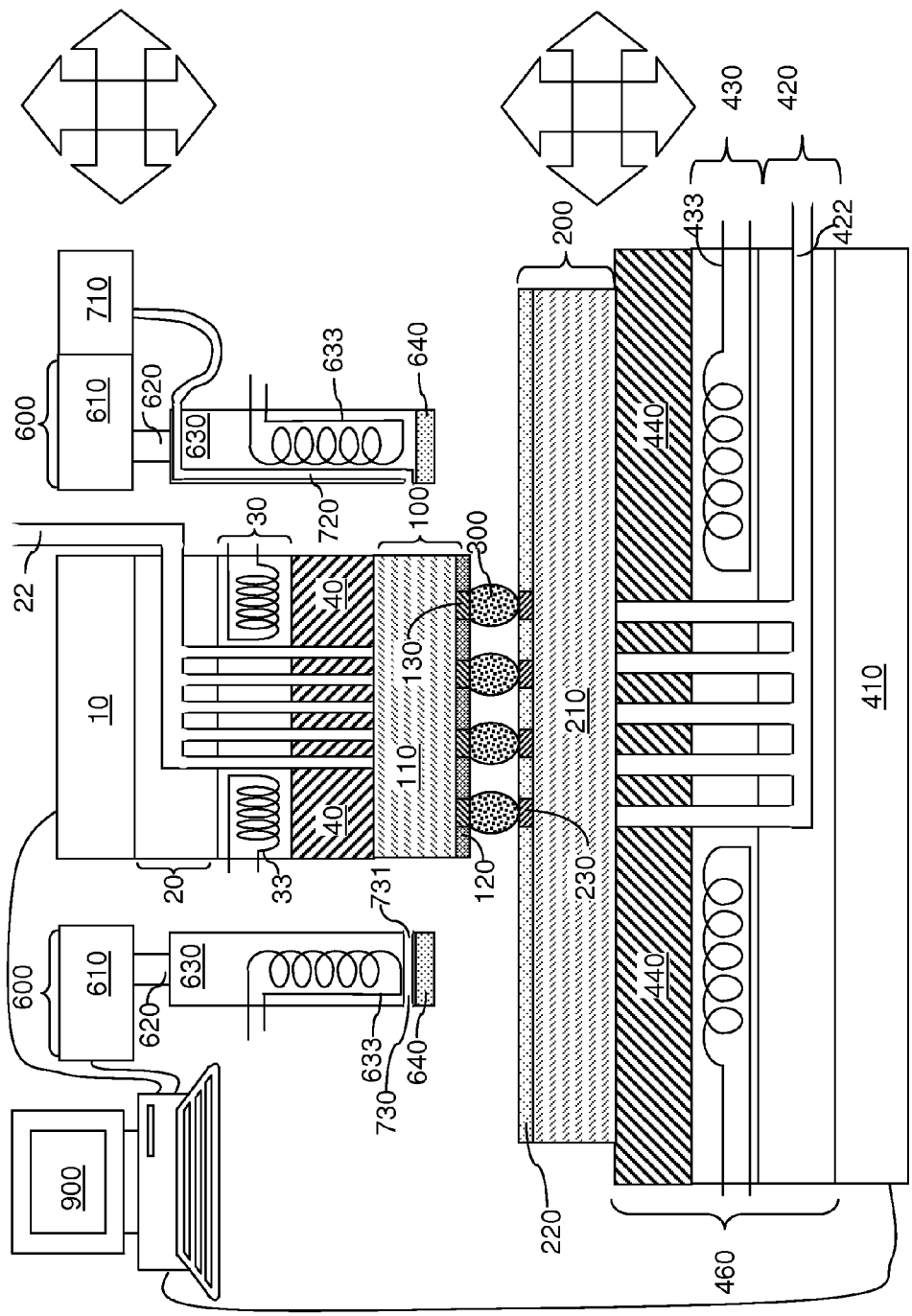
FIG. 6 is a vertical cross-sectional view of the exemplary structure after an array of solder balls makes a contact with an array of bonding pads on a second substrate according to an embodiment of the present disclosure.

Referring to FIG. 6, the bonder head movement actuator 10 and/or the base plate movement actuator 410 are employed to move the first substrate 100 and/or the second substrate 200 vertically toward each other until the array of solder balls 300 contacts the second substrate 200. The relative movement of the first substrate 100 and the second substrate 200 can be performed while the second substrate 200 is held at the first temperature and the first substrate 100 is held at the second temperature. Thus, the array of solder balls 300 can be brought into physical contact with the second substrate 200 while the first substrate 100 is maintained at the second temperature. The bonder head 60 remains in contact with the back side of the first substrate 100 even after the array of solder balls 300 contacts the second substrate 200.

Figure 7:
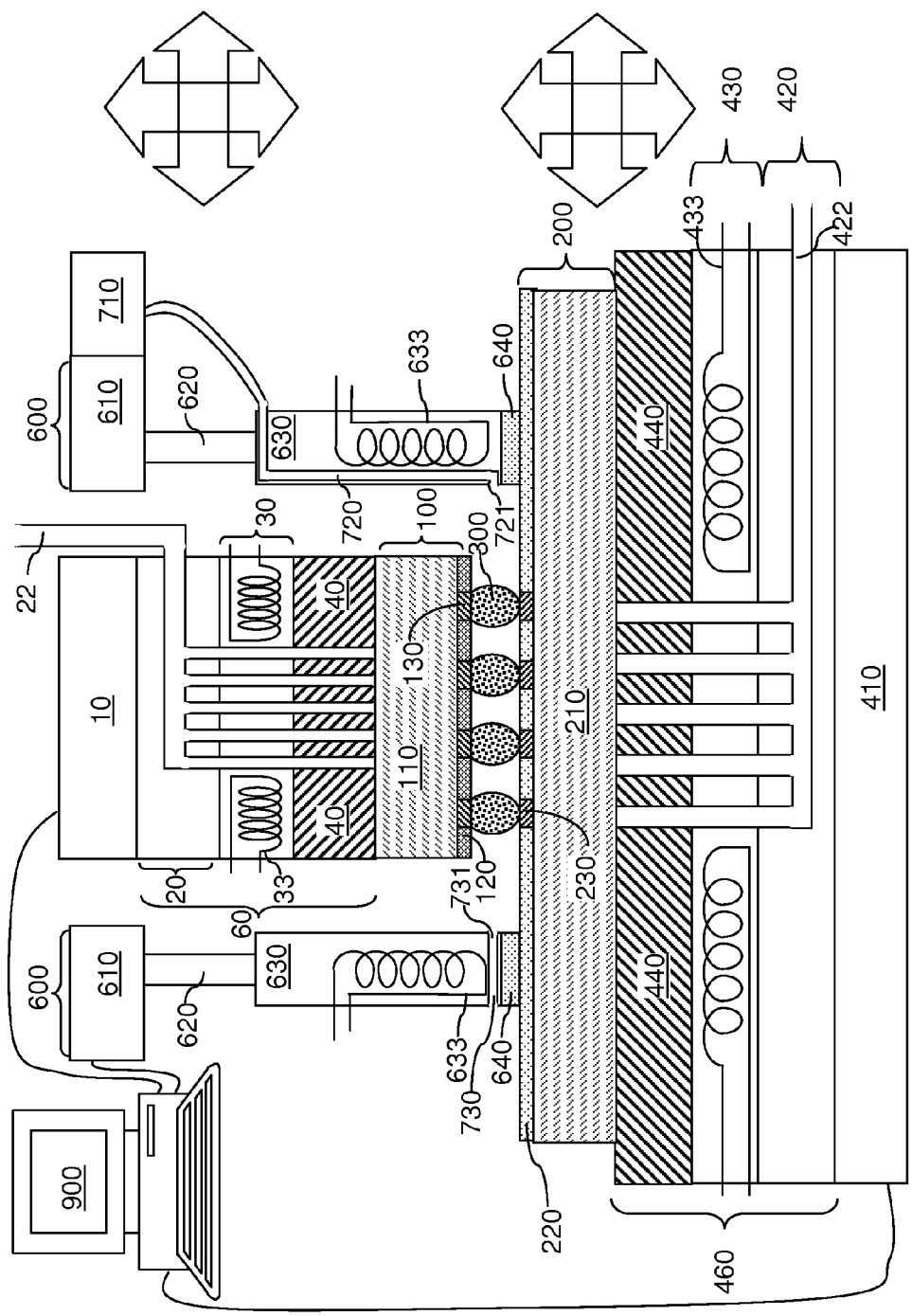
FIG. 7 is a vertical cross-sectional view of the exemplary structure after contacting a deformable material pad on a warpage-suppressor assembly with a top surface of the second substrate according to an embodiment of the present disclosure.

Referring to FIG. 7, the at least one actuator assembly (610, 620) is employed to vertically move each of the at least one deformable material pad 640 toward the top surface of the second substrate 200. The at least one warpage-suppressor assembly 600 including the at least one actuator assembly (610, 620) can be controlled by the control means 900. The at least one actuator assembly (610, 620) can be employed to move the at least one deformable material pad 640 to a position that contacts the second substrate 200.

The at least one deformable material pad 640 presses down on the second substrate 640 with a predetermined force or with a predetermined pressure. The magnitude of the predetermined force or the predetermined pressure can be set at a level that is sufficient to prevent deformation of the second substrate 200. In one embodiment, the magnitude of the predetermined force or the predetermined pressure can be at a level that causes deformation of the at least one deformable material pad 640 while the at least one deformable pad 640 is pressed against the second substrate 200 by the at least one actuator assembly (610, 620).

While the present disclosure describes an embodiment in which the array of solder balls 300 contacts the second substrate 200 prior to the physical contact between the at least one deformable material pad 640 and the second substrate 200, embodiments are also contemplated herein in which the array of solder balls 300 contacts the second substrate 200 concurrently with, or after, the physical contact between the at least one deformable material pad 640 and the second substrate 200.

Figure 8:
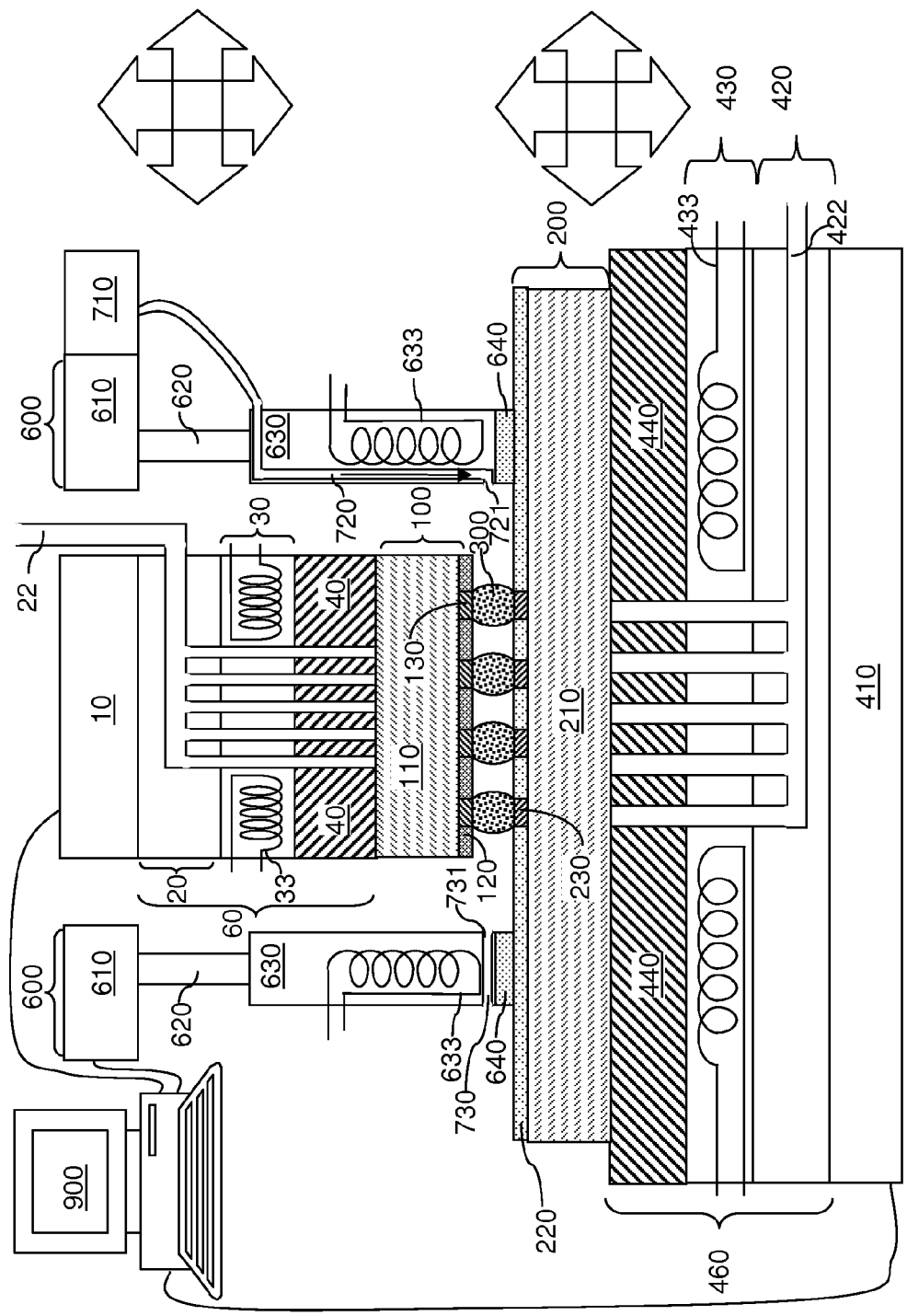
FIG. 8 is a vertical cross-sectional view of the exemplary structure after reflowing an array of solder balls according to an embodiment of the present disclosure.

Referring to FIG. 8, the temperature of the array of solder balls 300 is raised above the melting temperature of the array of solder balls 300 after the array of solder balls 300 is brought into physical contact with the second substrate 200. The array of solder balls 300 is heated to the third temperature by providing heat from the bonder head 60 through the first substrate 100 to the array of solder balls 300 while the bonder head 60 maintains physical contact with the first substrate 100. The third temperature exceeds the melting temperature of solder balls 300 by 0.1 to 250 degrees Celsius, and typically by 1 to 200 degrees Celsius. The temperature ramp from the second temperature to the third temperature may take about 1 seconds to 10 seconds, although lesser and greater ramp rates can also be employed depending on the thermal conductivity of the first substrate 100 and the size of the solder material portions in the array of solder balls 300.

The third temperature is greater than the melting temperature of the array of solder balls 300, which is greater than the first temperature. Thus, there necessarily exists a vertical temperature gradient across the first substrate 100 and the second substrate 200, and due to limitations in thermal conductivity, the temperature of the array of solder balls 300 is between the melting temperature and the third temperature while the first substrate 100 is held at the third temperature and the second substrate 200 is held at the first temperature. During the reflow of the array of solder balls 300, the bonder head 60 can continue to provide heat to the array of solder balls 300 to maintain the array of solder balls 300 at the third temperature, which may last between 0.1 second to 30 seconds, and typically from 0.5 second to 5 seconds.

The base plate 460 can be held at the first temperature while the array of solder balls 300 is heated to the third temperature. Because the second substrate 200 has a greater thermal mass than the array of solder balls 300 by orders of magnitude, and the heat flow from the first substrate 100 into the second substrate 200 is constricted at the array of solder balls 300, the temperature of the second substrate 200 remains substantially the same as the first temperature except for local heating directly underneath the array of solder balls 300. The second substrate 200 and the first substrate 100 are held flat by the flat top surface of the base plate 460 and the flat bottom surface of the bonder head 60 and the vacuum suctions applied to the back side of the second substrate 200 and to the back side of the first substrate 100.

The heat required to reflow the array of solder balls 300 can be primarily supplied by the at least one bonder head heating coil 33, and additionally supplied by the at least one side heater 630. Particularly, the additional heat provided by the at least one side heater 630 can compensate for additional loss of heat at peripheral solder balls 300 within the array of solder balls 300 due to greater exposure to a lower temperature ambient, i.e., by not being surrounded by as many solder balls 300 at, or above, the reflow temperature compared to solder balls 300 in the middle of the array of solder balls. By heating the peripheral solder balls among the array of solder balls 300 employing the at least one side heater 630 during the reflow step, reflow of the peripheral solder balls can be facilitated.

In one embodiment, a purge gas can be flowed through the array of solder balls 300 during the reflow step. Further, the flow of the purge gas can be laterally confined employing the at least one warpage-suppressor assembly 600, which can laterally surround the bonder head 60, the first substrate 100, and the array of solder balls 300 during the reflow step with, or without, any lateral gap thereamongst. Further, the purge gas can be extracted through a portion of the at least one warpage-suppressor assembly, i.e., through a purge gas extraction means 730 and/or any lateral gap among a plurality of warpage-suppressor assemblies (if the at least one warpage-suppressor assembly 600 is a plurality of warpage-suppressor assemblies).

In one embodiment, the purge gas can be heated prior to flowing the purge gas through the array of solder balls 300 by passing the purge gas through a gas heating tube, i.e., a portion of the purge gas supply tube 720, that passes through at least one side heater 630 provided within the at least one warpage-suppressor assembly 600.

Optionally, the vertical distance between the first substrate 100 and the second substrate 200 can be changed while the temperature of the array of solder balls 300 is above the melting temperature of the array of solder balls 300. For example, the distance between the first substrate 100 and the second substrate 200 can be decreased below a bonding distance, which is defined as the vertical distance between the first substrate 100 and the second substrate after bonding, i.e., after the array of solder balls 300 solidify. The vertical distance is measured between the topmost surface of the second substrate 200 including any bonding pads or equivalent structures and the bottommost surface of the first substrate 100 including any bonding pads or equivalent structure, and the array of solder balls 300 is treated as if not present for the purpose of measuring the bonding distance.

In one embodiment, the distance between the first substrate 100 and the second substrate 200 can be temporarily increased above, or decreased below, the bonding distance. In general, the first substrate 100 can be alternately moved relative to the second substrate 200 to distances less than the bonding distance at least once and/or greater than the bonding distance at least once while temperature of the array of solder balls 300 remains above the melting temperature of the array of solder balls 300.

The optional dynamic control of the distance between the first substrate 100 and the second substrate 200, which is referred to as "Z-height control." The Z-height control is performed while the solder material of the array of solder balls 300 remains melted so that all solder bumps are jointed without interfaces between solder materials or solder bridging. Subsequently, the distance between the first substrate 100 and the second substrate 200 is maintained at the bonding distance during cooling of the array of solder balls 300 from the third temperature that is above the melting temperature at least to a temperature below the melting temperature.

The array of solder balls 300 is bonded to the second substrate 200 and to the first substrate 100 upon cooling of the array of solder balls 300, thereby forming a bonded substrate. The array of solder balls 300 is bonded to the first substrate 100 and the second substrate 200 upon cooling of the array of solder balls 300 to a forth temperature, which is lower than the melting temperature of the material of the array of solder balls 300, while the second substrate 200 is held at the first temperature. The forth temperature can be lower than the melting temperature of solder by a temperature difference from 0.1 degree Celsius to 200 degree Celsius. The array of solder balls 300 is bonded directly to second bonding pads 230 on the second substrate 200 upon cooling of the array of solder balls 300.

The second substrate 200 is held upon the base plate 460, for example, by vacuum suction, thereby minimizing warpage of the second substrate 200. The first substrate 100 is held by the bonder head 60, for example, by vacuum suction, thereby minimizing warpage of the first substrate 100.

The at least one deformable material pad 640 continues to press down on the top surface of the second substrate 200, thereby counteracting the tendency of the second substrate 200 to warp due to the elevated temperature of the second substrate 200 during bonding. The location(s) at which the at least one deformable material pad 640 presses down on the second substrate 200 can be selected to minimize overall warpage of the second substrate 200 after the bonding process. The at least one warpage-suppressor assembly 600 including the at least one actuator assembly (610, 620) can be controlled by the control means 900. The at least one actuator assembly (610, 620) can be employed to continue to press down on the second substrate 200 with the at least one deformable material pad 640 throughout the duration of the reflow step and optionally a first time period of a cooldown step that immediately follows the reflow step.

The force or pressure with which at least one deformable material pad 640 presses down on the second substrate 640 can be constant throughout the duration of the reflow step, and optionally, during the first time period of the cooldown step. The magnitude of the predetermined force or the predetermined pressure can be set at a level that is sufficient to prevent deformation of the second substrate 200 during the reflow step, and optionally, during the first time period of the cooldown step.

Figure 9:
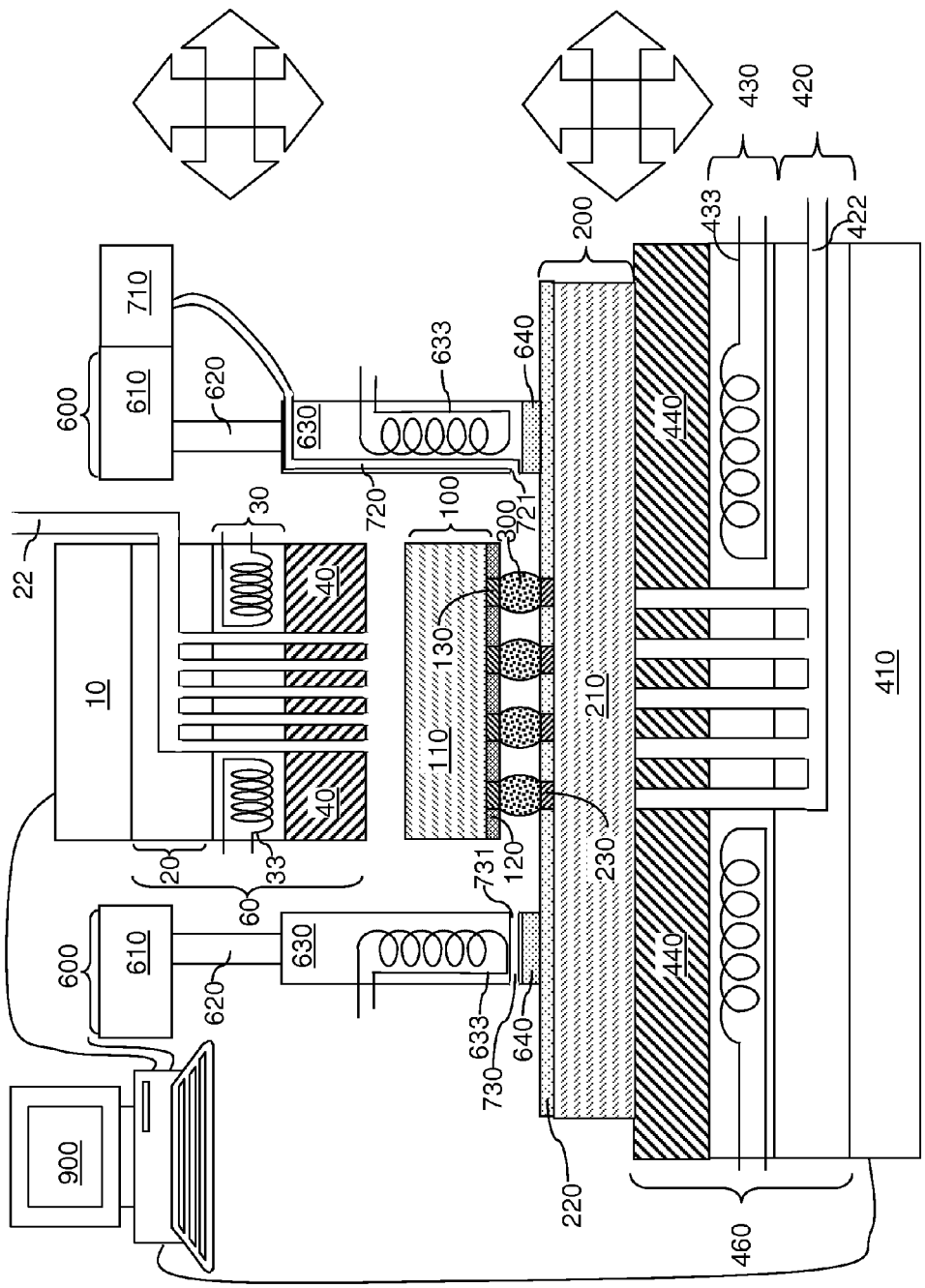
FIG. 9 is a vertical cross-sectional view of the exemplary structure after a bonder head disengages a first substrate according to an embodiment of the present disclosure.

Referring to FIG. 9, at a time within the first time period of the cooldown step or immediately after the reflow step, the bonder head disengages the first substrate 100, for example, by turning off the vacuum suction provided through the vacuum manifold 22. The time at which the bonder head disengages the first substrate 100 can be before the termination of the first time period, i.e., a subset time period may be present within the first time period during which the bonder head disengages the first substrate 100. The duration of the time period, if any, after the reflow period during which the bonder head engages the first substrate 100 and the duration of the subset time period can be optimized to reduce the total stress within the bonded substrate including the first substrate 100, the second substrate 200, and the array of solder balls 300 bonded to the first and second substrates (100, 200).

In one embodiment, the at least one deformable material pad 640 can be controlled to press against the surface of the second substrate during the entirety of the first time period of the cooldown step that follows the reflow step.

Figure 10:
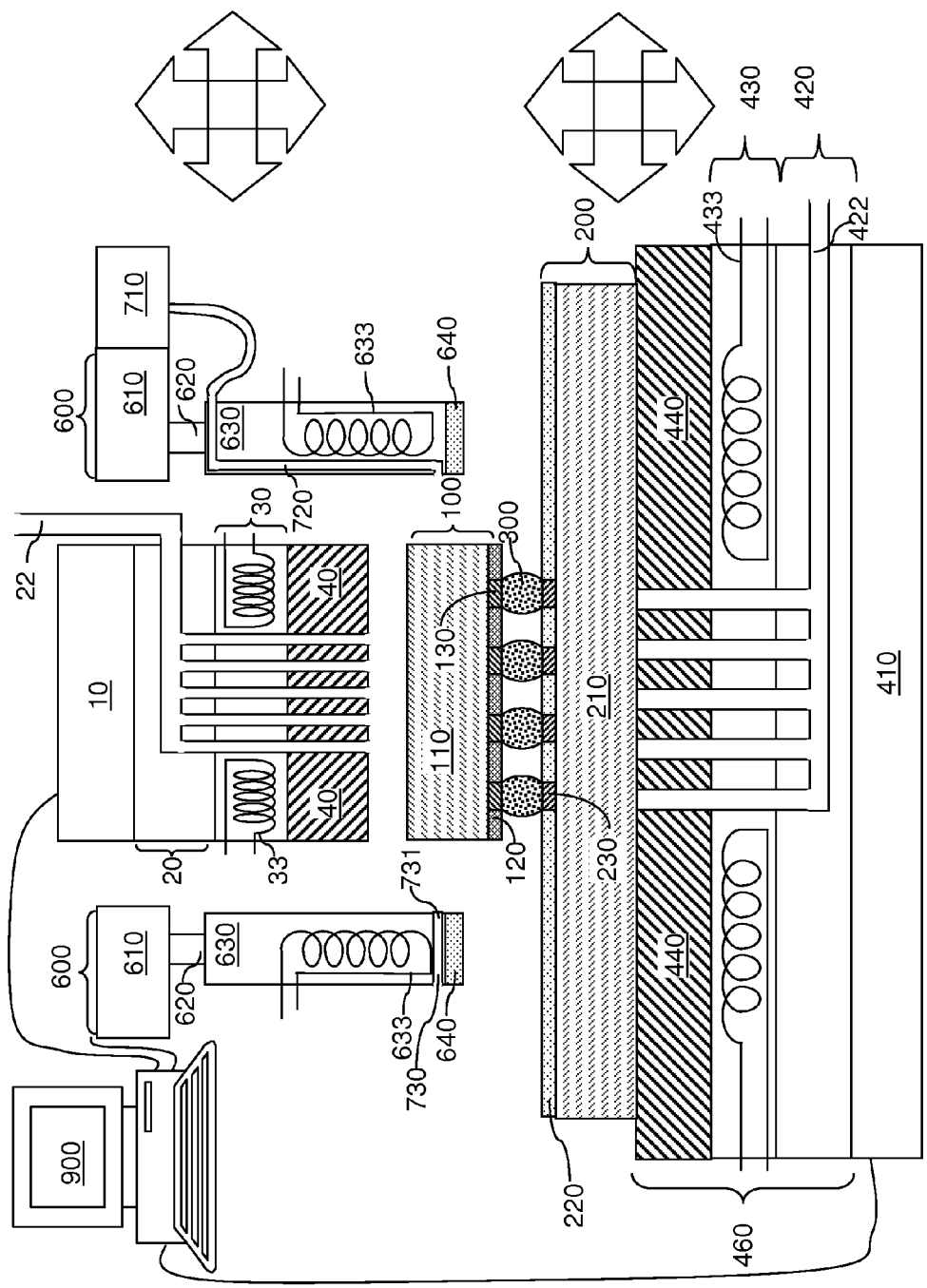
FIG. 10 is a vertical cross-sectional view of the exemplary structure after the deformable material pad disengages the second substrate according to an embodiment of the present disclosure.

Referring to FIG. 10, the at least one deformable material pad 640 disengages the second substrate 200 at the end of the first time period of the cooldown step, for example, by moving up the at least one side heater 630 and the at least one deformable material pad 640 through the at least one movable actuator element 620. The movement of the at least one movable actuator element 620 can be effected by controlling the relative position of the static actuator element 620 and the at least one movable actuator element 620 through the control means 900. Thus, the at least one deformable material pad 640 can be moved to a position that does not contact the second substrate 200 at a time after the reflow step employing the at least one actuator assembly (610, 620). Thus, the at least one deformable material pad 640 does not to press against the surface of the second substrate 200 during a second time period of the cooldown step that follows the first time period of the cooldown step.

Figure 11:
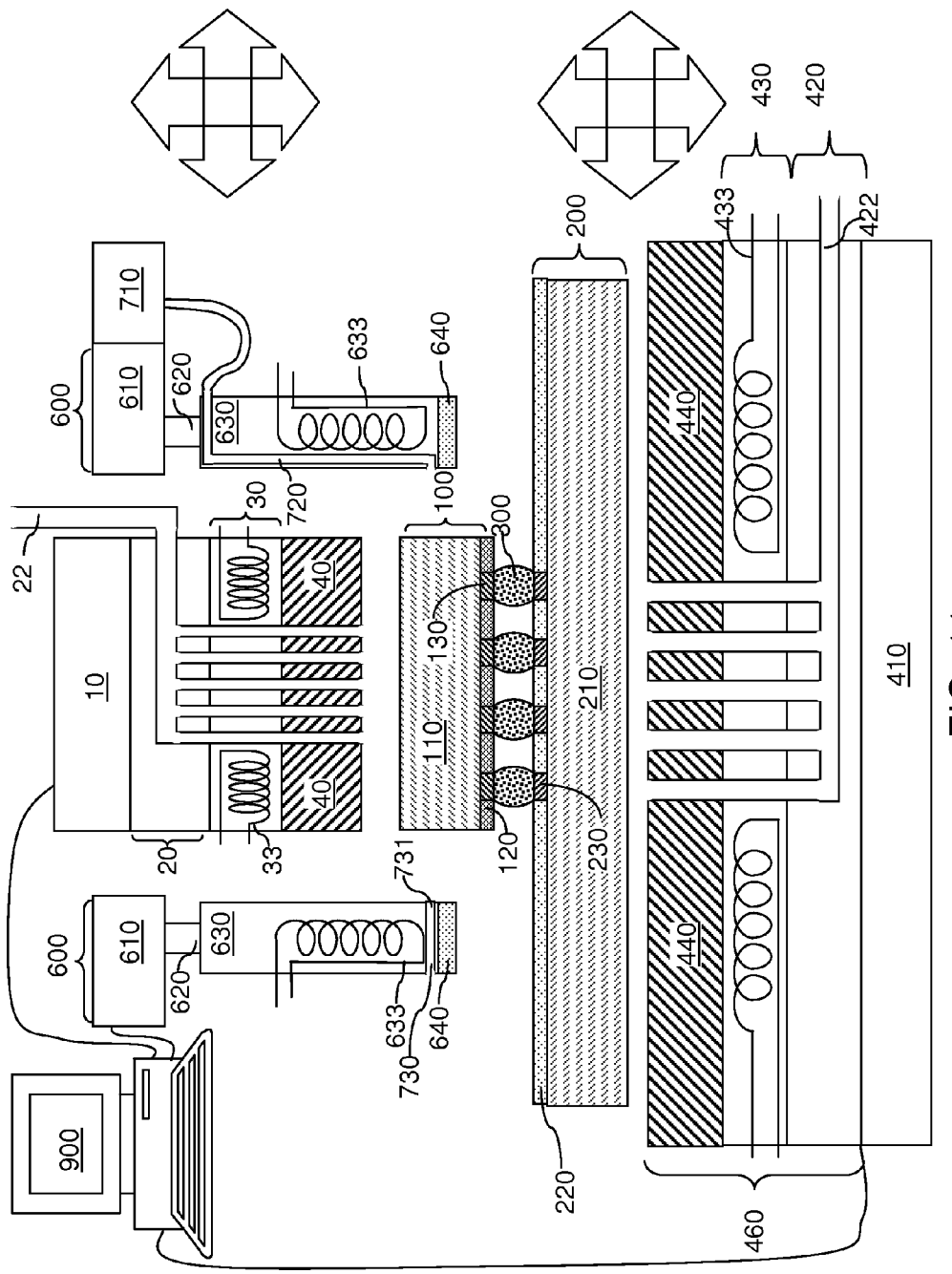
FIG. 11 is a vertical cross-sectional view of the exemplary structure after vacuum suction on the second substrate is released according to an embodiment of the present disclosure.

Referring to FIG. 11, the second substrate is released from the base plate 460, for example, by turning off the vacuum suction provided through the vacuum manifold 422 after further cooldown of the bonded substrate (100, 200, 300). The bonded substrate (100, 200, 300) can be subsequently removed from the exemplary apparatus. Optionally, underfill material can be filled the gap between the first substrate 100 and the second substrate 200 before the second substrate is released from the base plate 460.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A bonding apparatus comprising:
a bonder head configured to hold a first substrate upside down;
a base plate configured to hold a second substrate in a position facing said first substrate; and
at least one warpage-suppressor assembly including:
at least a deformable material pad configured to press against a surface of said second substrate in a position,
an actuator assembly for moving said deformable material pad, and
a side heater configured to heat a region between said first substrate and said second substrate and configured to laterally surround said bonder head, said first substrate, and said second substrate while said bonder head and said base plate are positioned to hold said first and second substrate therebetween, wherein said actuator assembly is configured to move said side heater.

2. The bonder apparatus of claim 1, further comprising a control means configured to turn on each of said at least one side heater during a reflow step in which solder balls between said first substrate and said second substrate are reflowed.

3. The bonder apparatus of claim 1, further comprising a control means configured to control said actuator assembly to cause said at least one deformable material pad to press against said surface of said substrate during a reflow step in which solder balls between said first substrate and said second substrate are reflowed.

4. The bonder apparatus of claim 3, wherein said control means is further configured to control said actuator assembly to cause said at least one deformable material pad not to press against said surface of said substrate before a predetermined time prior to said reflow step.

5. The bonder apparatus of claim 3, wherein said control means is further configured to control said actuator assembly to cause said at least one deformable material pad to press against said surface of said substrate during a first time period of a cooldown step that follows said reflow step, and not to press against said surface of said substrate during a second time period of said cooldown step that follows said first time period of said cooldown step.

6. The bonder apparatus of claim 1, wherein said deformable material pad comprises an elastically deformable material.

7. The bonder apparatus of claim 1, wherein said deformable material pad comprises a thermally insulating deformable material.

8. The bonder apparatus of claim 1, wherein said deformable material pad comprises at least one of an elastomer, a shape memory alloy, and plastics.

9. The bonder apparatus of claim 1, wherein said at least one warpage-suppressor assembly is a single contiguous warpage-suppressor assembly configured to laterally surround said first substrate during a reflow step in which solder balls between said first substrate and said second substrate are reflowed.

10. The bonder apparatus of claim 1, said at least one warpage-suppressor assembly is a plurality of warpage-suppressor assemblies configured to laterally surround said first substrate with lateral gaps thereamongst during a reflow step in which solder balls between said first substrate and said second substrate are reflowed.

11. The bonder apparatus of claim 1, further comprising a purge gas supply means configured to supply a purge gas around solder balls between said first substrate and said second substrate during a reflow step in which solder balls between said first substrate and said second substrate are reflowed.

12. The bonder apparatus of claim 11, further comprising a purge gas extraction means configured to extract said purge gas during said reflow step.

13. The bonder apparatus of claim 12, wherein said at least one warpage-suppressor assembly is a single contiguous warpage-suppressor assembly configured to laterally confine said purge gas.

14. The bonder apparatus of claim 11, further comprising a control means configured to turn on a flow of said purge gas at a time coinciding with, or having a predetermined offset relative to, commencement of a reflow step in which solder balls between said first substrate and said second substrate are reflowed.

15. A bonding apparatus comprising:
a bonder head configured to hold a first substrate upside down;
a base plate configured to hold a second substrate in a position facing said first substrate;
at least one warpage-suppressor assembly including at least a deformable material pad configured to press against a surface of said second substrate in a position, and an actuator assembly for moving said deformable material pad;
a side heater configured to heat a region between said first substrate and said second substrate; and
a purge gas supply means configured to supply a purge gas around solder balls between said first substrate and said second substrate during a reflow step, said gas supply means comprising a gas heating tube that passes through said side heater for heating said purge gas prior to flowing said purge gas around said solder balls.

16. The bonding apparatus of claim 15, wherein said actuator assembly is configured to move said side heater.

17. The bonder apparatus of claim 15, further comprising a control means configured to turn on each of said at least one side heater during a reflow step in which solder balls between said first substrate and said second substrate are reflowed.

18. The bonder apparatus of claim 15, further comprising a control means configured to control said actuator assembly to cause said at least one deformable material pad to press against said surface of said substrate during a reflow step in which solder balls between said first substrate and said second substrate are reflowed.

19. The bonder apparatus of claim 15, wherein said deformable material pad comprises an elastically deformable material.

20. The bonder apparatus of claim 15, wherein said deformable material pad comprises a thermally insulating deformable material.

21. The bonder apparatus of claim 15, wherein said deformable material pad comprises at least one of an elastomer, a shape memory alloy, and plastics.

22. The bonder apparatus of claim 15, wherein said at least one warpage-suppressor assembly is a single contiguous warpage-suppressor assembly configured to laterally surround said first substrate during a reflow step in which solder balls between said first substrate and said second substrate are reflowed.

23. The bonder apparatus of claim 15, said at least one warpage-suppressor assembly is a plurality of warpage-suppressor assemblies configured to laterally surround said first substrate with lateral gaps thereamongst during a reflow step in which solder balls between said first substrate and said second substrate are reflowed.

24. The bonder apparatus of claim 15, further comprising a purge gas extraction means configured to extract said purge gas during said reflow step.

25. A bonding apparatus comprising:
- a bonder head configured to hold a first substrate upside down;
- a base plate configured to hold a second substrate in a position facing said first substrate; and
- at least one warpage-suppressor assembly including:
  - at least a deformable material pad configured to press against a surface of said second substrate in a position,
  - an actuator assembly for moving said deformable material pad, and
  - a side heater configured to heat a region between said first substrate and said second substrate and configured to laterally surround said bonder head, said first substrate, and said second substrate while said bonder head and said base plate are positioned to hold said first and second substrate therebetween.

\* \* \* \* \*